(12) United States Patent
Uda et al.

(10) Patent No.: US 6,376,898 B1
(45) Date of Patent: Apr. 23, 2002

(54) BIPOLAR TRANSISTOR LAYOUT WITH MINIMIZED AREA AND IMPROVED HEAT DISSIPATION

(75) Inventors: Tomoya Uda; Daisuke Ueda; Tsuyoshi Tanaka; Manabu Yanagihara, all of Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/631,104

(22) Filed: Aug. 1, 2000

(51) Int. Cl.[7] .............................. H01L 29/73
(52) U.S. Cl. ...................... 257/566; 257/565
(58) Field of Search .................. 257/563, 579, 257/580, 581, 401, 503, 205, 197, 566, 565, 571, 573

(56) References Cited

U.S. PATENT DOCUMENTS

| | | | |
|---|---|---|---|
| 5,003,370 A | * | 3/1991 | Kashiwagi |
| 5,057,882 A | | 10/1991 | Pritchett |
| 5,387,813 A | * | 2/1995 | Iranmanesh et al. ........ 257/563 |
| 5,719,433 A | * | 2/1998 | Delage et al. |
| 5,929,468 A | * | 7/1999 | Asano |
| 6,051,871 A | * | 4/2000 | DeLaCruz et al. |

FOREIGN PATENT DOCUMENTS

JP 07-142604 6/1995

* cited by examiner

Primary Examiner—Nathan Flynn
Assistant Examiner—Kevin Quinto
(74) Attorney, Agent, or Firm—Eric J. Robinson; Nixon Peabody LLP

(57) ABSTRACT

An inventive semiconductor integrated circuit device includes multiple transistor banks over a substrate. The banks are arranged to be substantially parallel to each other in a planar layout of the device. Each said bank includes a plurality of unit transistors, each including a base, an emitter and a collector. In the planar layout of the device, a position of a first one of the transistors is shifted from a position of a second one of the transistors in a direction in which the banks extend. The first and second transistors belong to first and second ones of the banks, respectively, which are adjacent to each other. The second transistor is closer to the first transistor than any other transistor in the second bank.

2 Claims, 3 Drawing Sheets

BIPOLAR TRANSISTOR LAYOUT WITH MINIMIZED AREA AND IMPROVED HEAT DISSIPATION

BACKGROUND OF THE INVENTION

The present invention generally relates to a semiconductor integrated circuit device, and more particularly relates to the arrangement of heterojunction bipolar transistors as a high-output power amplifier operating in the microwave region.

In a bipolar transistor, a positive correlation is found between the emitter current and the temperature of the transistor. That is to say, as the temperature of the transistor rises, its emitter current increases. And the increase in emitter current makes the transistor generate heat, thus further raising the temperature of the transistor. As a result, a condition called "thermal runaway" might be created and the transistor might possibly be damaged unless appropriate precautions are taken.

Accordingly, a known power amplifier including multiple heterojunction bipolar transistors, in each of which at least two compound semiconductor epitaxial layers with mutually different compositions are stacked, is constructed in the following manner to obtain high output power and good heat dissipation. A power amplifier of this type will be herein called a "power HBT device".

Hereinafter, the known power HBT device will be described with reference to FIG. 3.

FIG. 3 illustrates a planar layout for the known power HBT device. As shown in FIG. 3, multiple banks 105 of unit cells 104 are arranged over a semi-insulating GaAs substrate, on which multiple compound semiconductor epitaxial layers are stacked one upon the other. Each unit cell 104 includes unit base, unit collector and unit emitter electrodes 101, 102 and 103. In each unit cell bank 105, two adjacent unit cells 104 are spaced apart from each other by a distance D1, which will be herein called an "intra-cell-bank cell space". To avoid the thermal runaway by minimizing the thermal interference between the cells and yet not to increase the chip size too much, the intra-cell-bank cell space D1 is defined at an optimum value d.

Two adjacent unit cell banks 105 are placed in parallel to each other and spaced apart from each other by a predetermined distance D2, which will be herein called an "inter-cell-bank space". And the number of unit cells 104 included in each single unit cell bank 105 and the number of unit cell banks 105 are determined by the required output power and the required chip size.

As shown in FIG. 3, a first unit cell 104 included in a first unit cell bank 105 is spaced apart from a second unit cell 104, which is closest to the first unit cell 104 and included in a second unit cell bank 105 adjacent to the first bank 105, by a distance D3. In other words, if a line is drawn from the center of the first unit cell 104 vertically to the first bank 105 within the substrate plane, then the second unit cell 104 is located at the intersection of the line with the second unit cell bank 105. The distance D3 will be herein called an "inter-cell-bank cell space" and is equal to the inter-cell-bank space D2.

In this manner, multiple unit cells 104, in each of which the unit emitter electrode 103 occupies a relatively small area on the chip, are arranged to be spaced apart from each other by the intra-cell-bank cell space D1 in the direction in which the banks 105 extend (which will be herein called a "bank direction"). In the direction vertical to the bank direction, these unit cells 104 are spaced apart from each other by the inter-cell-bank space D2. Thus, compared to an arrangement in which each unit cell 104 is disposed with the periphery of its emitter electrode 103 elongated, the device can dissipate a much greater quantity of heat.

Also, by operating multiple unit cells 104 in parallel, the total periphery length of the emitters increases. As a result, a much greater amount of current can flow and the output power can be increased considerably.

In the known power HBT device, however, the inter-cell-bank cell space D3 should be kept at its optimum value d or more, and therefore, the inter-cell-bank space D2 should also be kept at the optimum value d or more. Thus, in the direction vertical to the bank direction, the width of the chip can be no smaller than a value determined by the optimum value d and the number of unit cell banks 105. In addition, since a great number of unit cells 104 are arranged and equally spaced part from each other on a single chip, heat cannot be dissipated equally from these unit cells 104. That is to say, the heat dissipated from a unit cell 104 located around the center of the chip is different in quantity from the heat dissipated from another unit cell 104 located around an end of the chip.

SUMMARY OF THE INVENTION

It is therefore an object of the present invention to provide a semiconductor integrated circuit device that can dissipate a good quantity of heat equally while minimizing the chip area.

To achieve this object, an inventive semiconductor integrated circuit device includes multiple transistor banks over a substrate. The banks are arranged to be substantially parallel to each other in a planar layout of the device. Each said bank includes a plurality of unit transistors, each including a base, an emitter and a collector. In the planar layout of the device, a position of a first one of the transistors is shifted from a position of a second one of the transistors in a direction in which the banks extend. The first and second transistors belong to first and second ones of the banks, respectively. The second bank is adjacent to the first bank. And the second transistor is closer to the first transistor than any other transistor in the second bank.

In the inventive semiconductor integrated circuit device, the position of the first transistor, belonging to the first bank, is shifted from that of the second transistor, belonging to the second bank adjacent to the first bank, in the direction in which the banks extend. Thus, compared to the known arrangement, the distance between most closely disposed transistors is greater in a pair of mutually adjacent banks. Accordingly, the heat generated does not locally concentrate between adjacent transistor banks. As a result, it is possible to dissipate a greater quantity of heat while increasing the number of transistors that can be integrated within the same area.

In one embodiment of the present invention, the device further includes multiple base lines and collector lines over the substrate. Each said bank is associated with one of the base lines and one of the collector lines. Each said base line connects together the bases of the transistors belonging to the associated bank. Each said collector line connects together the collectors of the transistors belonging to the associated bank. And each said bank is interposed between the base and collector lines that are associated with the bank. If the inventive integrated circuit device is implemented as an amplifier using the base and collector as its input and output terminals, respectively, then signal inputting and outputting pads can be connected to the base and collector lines, respectively, without making the base and collector lines intersect each other. As a result, the parasitic capacitance between the signal input and output terminals can be reduced and therefore the gain of the amplifier can be increased.

In another embodiment of the present invention, the transistors in each said bank are preferably substantially equally spaced apart from each other. In such an embodiment, the heat, generated in a bank, does not concentrate locally between adjacent transistors. As a result, a good quantity of heat can be dissipated substantially equally.

In this particular embodiment, the position of the first transistor is preferably shifted from that of the second transistor by half a distance between adjacent ones of the transistors belonging to the first bank in the direction in which the banks extend. In such an embodiment, a pair of transistors, which belong to the first bank and are adjacent to each other in the bank direction, is farthest away from another transistor, which belongs to the second bank and is adjacent to the pair of transistors in the direction vertical to the bank direction. Thus, an even greater quantity of heat can be dissipated in such an arrangement. In addition, the transistors can be arranged more symmetrically over the substrate in both the bank direction and the direction vertical to the bank direction. As a result, the heat can be dissipated even more equally.

More specifically, two adjacent ones of the transistors, which belong to the first bank and include the first transistor, and the second transistor are preferably disposed at respective vertices of an equilateral triangle. In such an embodiment, if any two adjacent transistor banks are equally spaced apart from each other, the distance between unit transistors becomes shortest. That is to say, the transistors can be arranged at the highest density over the substrate, thus greatly reducing the chip area.

In still another embodiment, a distance between two adjacent ones of the banks in a center region of the substrate is greater than a distance between another two adjacent ones of the banks in an end region of the substrate. In general, a greater quantity of heat can be dissipated from around the ends of a substrate than from around the center of the substrate. In this arrangement, however, the heat generated from the transistors is less likely to concentrate at the center of the transistor banks. As a result, an even greater quantity of heat can be dissipated much more equally.

In yet another embodiment, the device preferably further includes a metal film, which covers the substrate and is electrically connected to the emitters of the transistors belonging to the banks. If the inventive semiconductor integrated circuit device is implemented as an amplifier, then the metal film, which covers the substrate and is connected to the emitter electrodes, makes it easier to realize amplification with the emitters grounded. In addition, the metal film can also function as a radiator plate, thus considerably increasing the quantity of heat dissipated.

DESCRIPTION OF THE PREFERRED EMBODIMENTS

Embodiment 1

Hereinafter, a first embodiment of the present invention will be described with reference to FIG. 1.

Figure 1:
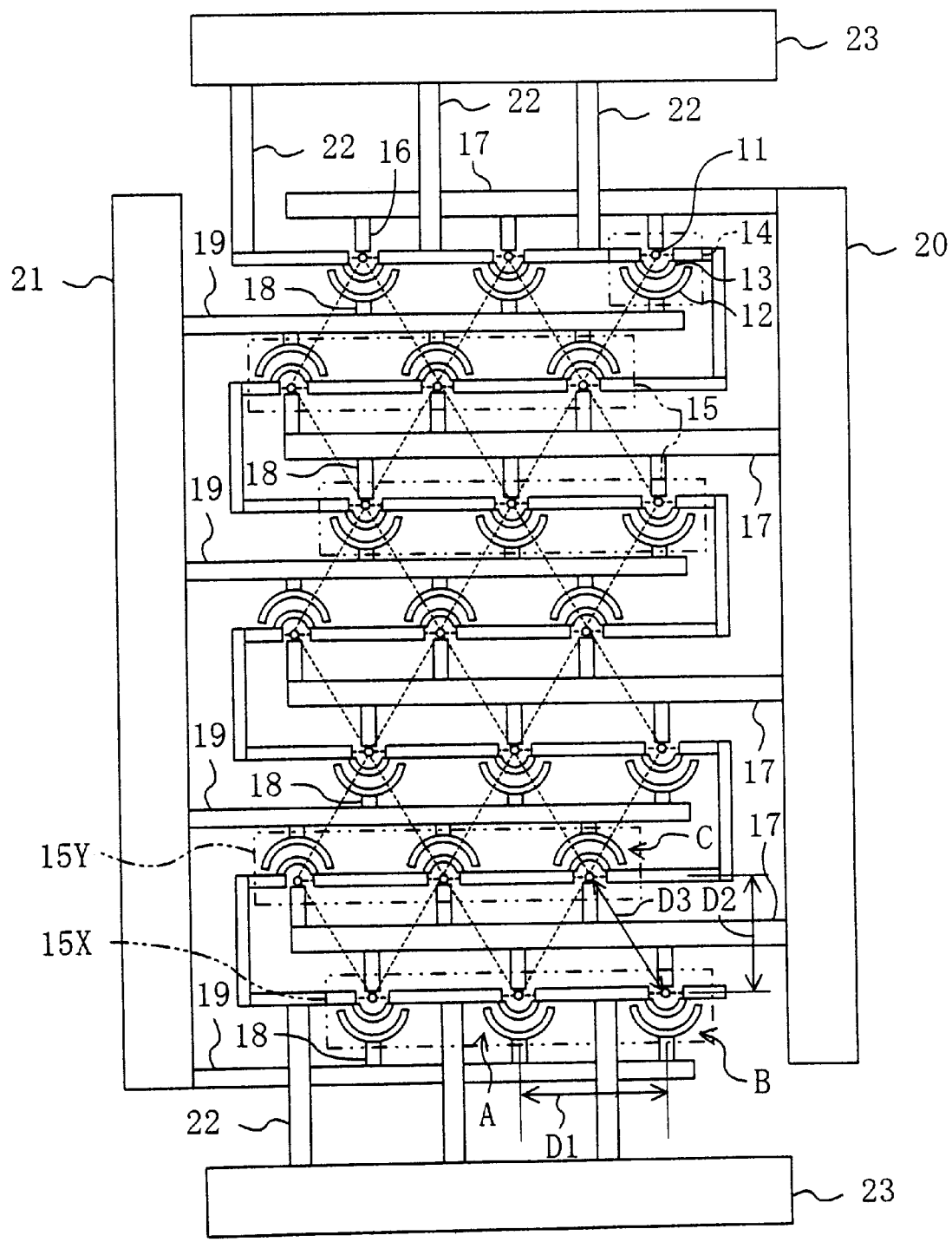
FIG. 1 is a plan view illustrating a semiconductor integrated circuit device according to a first embodiment of the present invention.

FIG. 1 illustrates a planar layout for a power HBT device, which is an exemplary semiconductor integrated circuit device according to the first embodiment. As shown in FIG. 1, seven unit cell banks 15 (which are equivalent to the transistor banks as defined in the claims) are arranged over a semi-insulating GaAs substrate, for example. Each bank 15 includes three unit cells 14 (which are equivalent to the unit transistors as defined in the claims). And each unit cell 14 includes unit base, collector and emitter electrodes 11, 12 and 13. The unit collector and emitter electrodes 12 and 13 are disposed concentrically around the unit base electrode 11. Specifically, the unit emitter electrode 13 is disposed between the circular unit base electrode 11 and the semicircular unit collector electrode 12. In the illustrated embodiment, the unit emitter electrode 13 has an area of about 50 $\mu m^2$.

In each unit cell bank 15, each pair of adjacent unit cells 14 are spaced apart from each other by a distance D1 (i.e., the intra-cell-bank cell space) of about 30 $\mu m$, and the three unit cells 14 are arranged substantially in line. The intra-cell-bank cell space D1 is selected at such a value as reducing the thermal interference between the cells to avoid the thermal runaway and yet not increasing the chip size so much.

The unit cell banks 15 are arranged to be substantially parallel to each other and spaced apart from each other by an inter-cell-bank space D2, which is ($\sqrt{3}/2$) times greater than the intra-cell-bank cell space D1. And the number of unit cells 14 included in each single unit cell bank 15 and the number of unit cell banks 15 are determined by the required output power and the required chip size.

Also, as shown in FIG. 1, two adjacent unit cells A and B belong to a unit cell bank 15X, while a unit cell C belongs to another unit cell bank 15Y adjacent to the unit cell bank 15X. The position of each of these unit cells A and B is laterally shifted from that of the unit cell C by half the distance between the unit cells A and B (=D/2) in the bank direction.

Accordingly, the intra-cell-bank cell space D1 is equal to the inter-cell-bank cell space D3, which is the distance between two unit cells 14 belonging to two mutually adjacent unit cell banks 15. That is to say, the unit cells A, B and C are disposed at respective positions that can be substantially represented as the three vertices of an equilateral triangle.

A base line 17 is provided along each unit cell bank 15 and electrically connected to the bank 15 via base line connectors 16. A collector line 19 is also provided along each unit cell bank 15 and electrically connected to the bank 15 via collector line connectors 18. However, the base and collector lines 17 and 19 are located on the opposite sides of the unit cell bank 15. That is to say, the collector line 19 is closer to the collectors 12 than to the bases 11. In such an arrangement, the seven unit cell banks 15 can operate in parallel with each other.

The base lines 17 are electrically connected to a signal input pad 20, which is located at one end of the unit cell banks 15 over the substrate. On the other hand, the collector lines 19 are electrically connected to a signal output pad 21, which is located at the other end of the unit cell banks 15 over the substrate.

Emitter lines 22 for supplying a ground potential to the respective unit emitter electrodes 13 are formed in a different layer from that of the base and collector lines 17 and 19 with an interlevel dielectric film interposed therebetween. One end of each emitter line 22 is electrically connected to the associated unit emitter electrode 13 via a plug that fills in a contact hole in the interlevel dielectric film deposited over the unit emitter electrode 13. The other end of each emitter line 22 is electrically connected to a grounding pad 23 provided along the unit cell banks 15 over the substrate. As shown in FIG. 1, the grounding pads 23 are located over the uppermost bank 15 and under the lowermost bank 15, respectively.

In this case, the entire surface of the substrate is preferably covered with a metal film, which is electrically connected directly not only to the emitter lines 22 or the plugs but also to the grounding pads 23. In such an embodiment, the metal film can function as a radiator for dissipating the heat generated from the unit cells 14. As a result, an even greater quantity of heat can be dissipated much more equally.

In this manner, the power HBT device according to the first embodiment constitutes a so-called emitter-grounded amplifier. In the power HBT device, the 21 unit cells 14 can operate in parallel, thereby increasing the total periphery length of the emitters, supplying a greater amount of current and increasing the output power. In addition, a large number of unit cells 14, in each of which the unit emitter electrode 13 occupies a relatively small area, are arranged and spaced apart from each other. Thus, the device can dissipate a greater quantity of heat, compared to a situation where the emitter periphery length of a single unit cell is increased.

Furthermore, according to this embodiment, each pair of adjacent unit cells 14 are equally spaced apart from each other whether these two cells 14 belong to a single unit cell bank 15 or two mutually adjacent unit cell banks.15 (i.e., D1=D3). Accordingly, the heat generated can be dissipated equally.

Moreover, supposing the intra-cell-bank cell space D1 is constant, the inter-cell-bank space D2 can be minimized to $(\sqrt{3}/2)D1$, and therefore, the chip area can also be minimized.

Embodiment 2

Next, a second embodiment of the present invention will be described with reference to FIG. 2.

Figure 2:
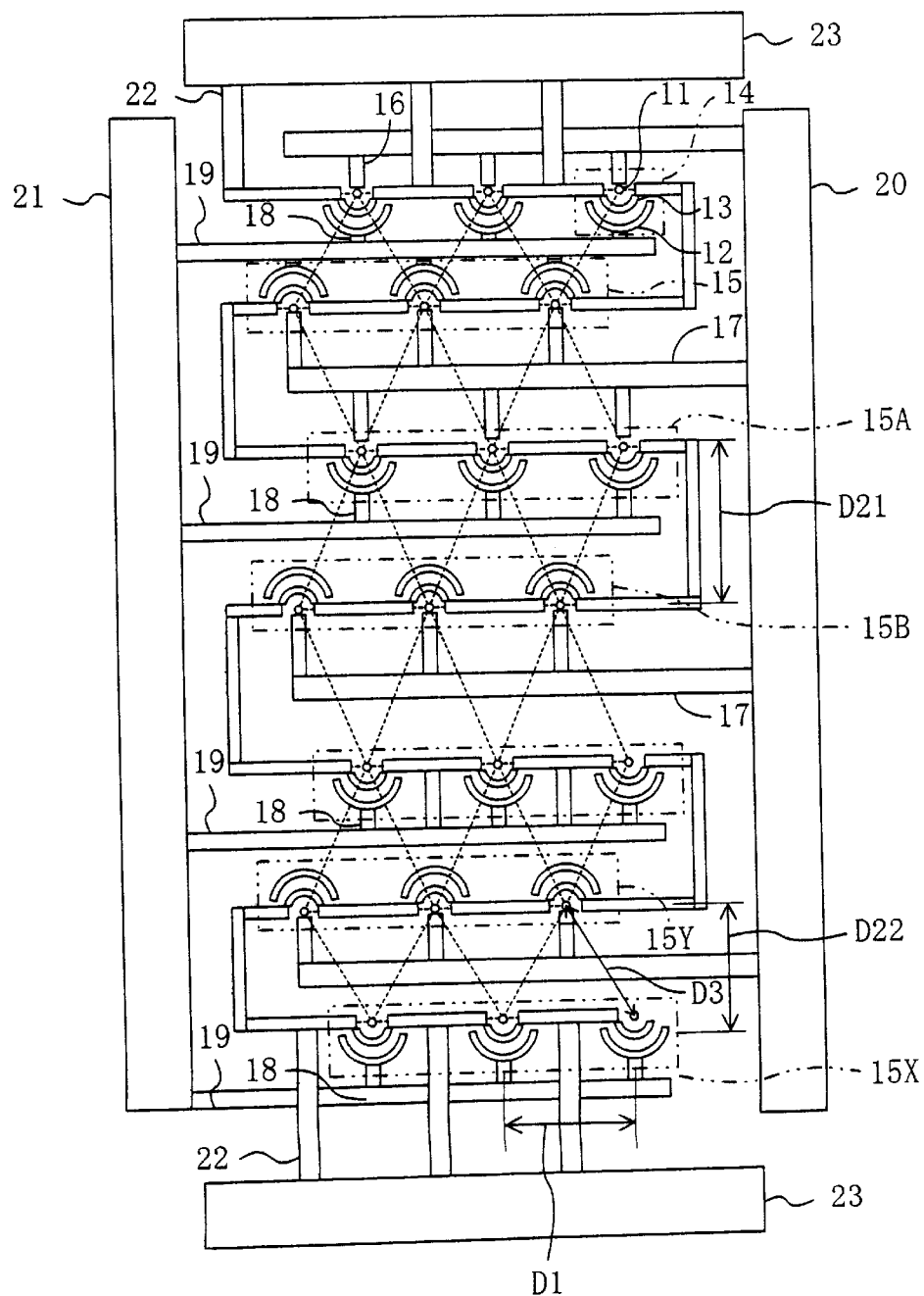
FIG. 2 is a plan view illustrating a semiconductor integrated circuit device according to a second embodiment of the present invention.
Figure 3:
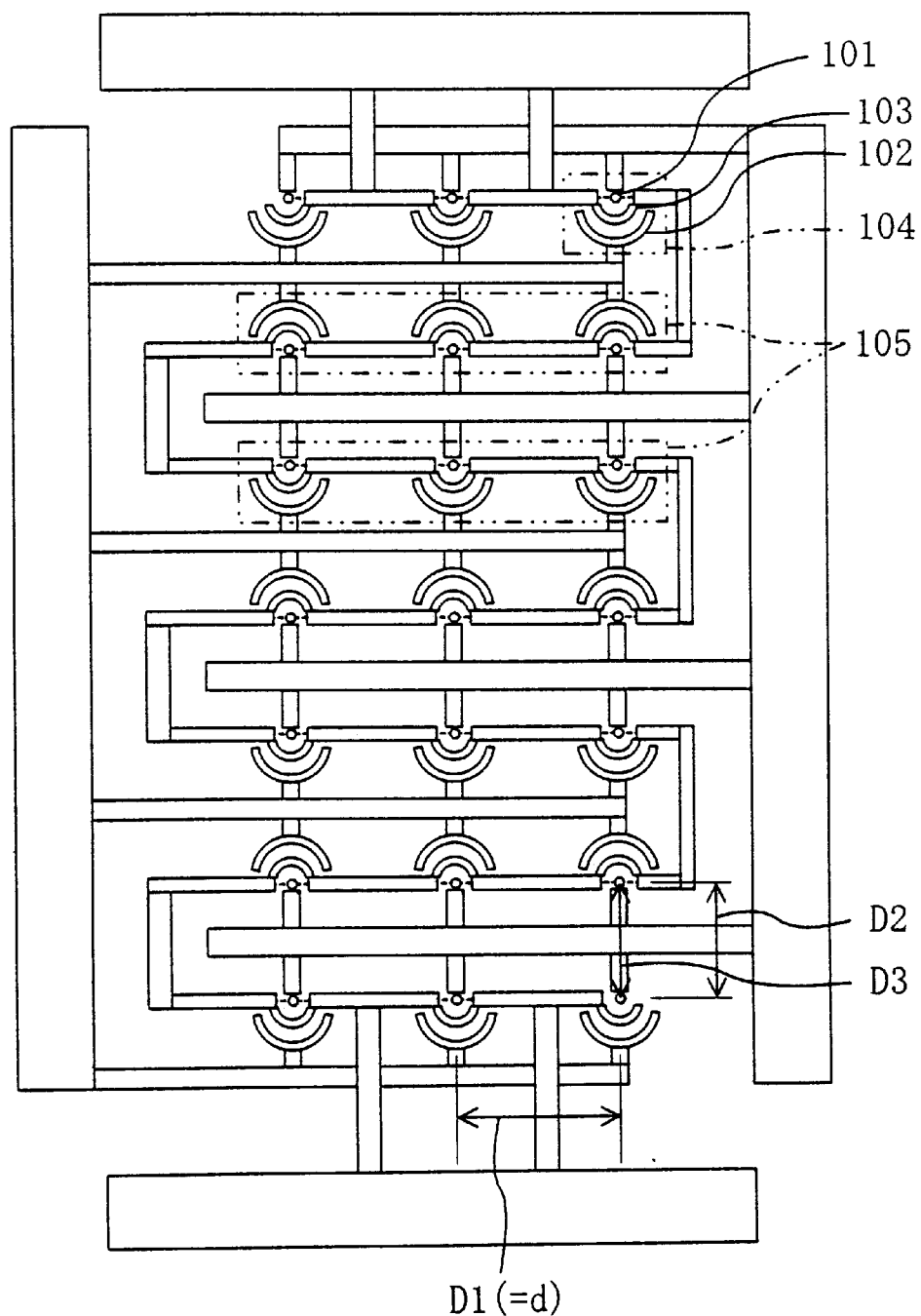
FIG. 3 is a plan view illustrating a known power HBT device.

FIG. 2 illustrates a planar layout for a power HBT device, which is an exemplary semiconductor integrated circuit device according to the second embodiment. In FIG. 2, the same components as those illustrated in FIG. 1 are identified by the same reference numerals and the description thereof will be omitted herein.

As shown in FIG. 2, an inter-cell-bank space D21 between unit cell banks 15A and 15B located around a center region of the substrate is greater than an inter-cell-bank space D22 between unit cell banks 15X and 15Y located around an end of the substrate in the power HBT device of the second embodiment.

In such an arrangement, the heat, generated from the unit cells 14, does not concentrate to around the center of the substrate. As a result, an even greater quantity of heat can be dissipated.

Generally speaking, the more distant from the ends of the substrate that absorbs heat, the less quantity of heat is dissipated from the substrate. Thus, by arranging the heat-generating unit cell banks 15 such that the inter-cell-bank space D21 around the center region of the substrate is greater than the inter-cell-bank space D22 around an end thereof, the balance between the quantities of heat dissipated and generated does not change so much from place to place. Accordingly, in the direction vertical to the direction in which the unit cell banks 15 extend, not so much heat concentrates to the center region of the substrate. As a result, the heat can be dissipated even more equally.

As in the first embodiment, the entire surface of the substrate is also preferably covered with a metal film, which is electrically connected not only to the emitter lines 22 or the plugs but also to the grounding pads 23. In such an embodiment, the metal film can function as a radiator for dissipating the heat generated from the respective unit cells 14. As a result, an even greater quantity of heat can be dissipated even more equally.

In the foregoing first and second embodiments, each unit cell 14 consists of a single circular unit base electrode 11, a single semi-circular unit collector electrode 12 and a single semi-circular unit emitter electrode 13. However, the shapes, numbers and arrangement of these electrodes are not limited to the exemplified ones, but may be defined arbitrarily for each unit cell 14.

Also, in the foregoing embodiments, the unit cells 14 together constitute a power HBT device. But similar effects are naturally attainable even if these unit cells 14 are any other type of bipolar transistors.

What is claimed is:

1. A semiconductor integrated circuit device comprising at least three transistor banks over a substrate, the banks being arranged to be substantially parallel to each other in a planar layout of the device, each said bank including a plurality of unit transistors, each unit transistor including a base, an emitter and a collector, wherein in the planar layout of the device, a position of a first one of the transistors is shifted from a position of a second one of the transistors in a direction in which the banks extend, the first and second transistors belonging to first and second ones of the banks, respectively, the second bank being adjacent to the first bank, the second transistor being closer to the first transistor than any other transistor in the bank, wherein in each said bank, the transistors are substantially equally spaced apart from each other, wherein the position of the first transistor is shifted from that of the second transistor by half a distance between horizontally adjacent ones of the transistors belonging to the first bank in the direction in which the banks extend, and wherein two diagonally adjacent ones of the transistors, which belong to the first bank and include the first transistor, and the second transistor are disposed at respective vertices of an equilateral triangle.

2. A semiconductor integrated circuit device comprising at least three transistor banks over a substrate, the banks being arranged to be substantially parallel to each other in a planar layout of the device, each said bank including a plurality of unit transistors, each unit transistor including a base, an emitter and a collector, wherein in the planar layout of the device, a position of a first one of the transistors is shifted from a position of a second one of the transistors in a direction in which the banks extend, the first and second transistors belonging to first and second ones of the banks, respectively, the second bank being adjacent to the first bank, the second transistor being closer to the first transistor than any other transistor in the bank, and wherein a perpendicular distance between two diagonally adjacent ones of each bank in a center region of the substrate is greater than a perpendicular distance between another two diagonally adjacent ones of each bank in an end region of the substrate.

* * * * *

UNITED STATES PATENT AND TRADEMARK OFFICE
CERTIFICATE OF CORRECTION

PATENT NO.   : 6,376,898 B1  
DATED        : April 23, 2002  
INVENTOR(S)  : Tomoya Uda et al.

It is certified that error appears in the above-identified patent and that said Letters Patent is hereby corrected as shown below:

<u>Title page,</u>  
Item [30], Foreign Application Priority Data, insert  
-- August 2, 1999    (JP)..........11-218290 --

Signed and Sealed this

Twenty-fourth Day of September, 2002

Attest:

Attesting Officer

JAMES E. ROGAN  
*Director of the United States Patent and Trademark Office*